United States Patent [19]
Prabhu et al.
[11] 4,452,844
[45] Jun. 5, 1984

[54] LOW VALUE RESISTOR INKS

[75] Inventors: Ashok N. Prabhu, Plainsboro; Kenneth W. Hang, Princeton Junction, both of N.J.

[73] Assignee: RCA Corporation, New York, N.Y.

[21] Appl. No.: 460,008

[22] Filed: Jan. 21, 1983

[51] Int. Cl.[3] .......... H05K 1/03; B32B 3/10

[52] U.S. Cl. .......... 428/209; 252/512; 252/514; 252/518; 252/519; 252/521; 338/308; 427/96; 427/101; 427/102; 427/126.2; 427/126.3; 427/123; 428/210; 428/427; 428/428; 428/432; 428/433; 428/434; 428/901

[58] Field of Search .......... 252/518, 519, 512, 514, 252/521; 338/308; 428/433, 432, 434, 428, 427, 209, 210, 472, 471, 901, 701; 427/96, 101, 102, 126.2, 126.3, 123

[56] References Cited

U.S. PATENT DOCUMENTS

| | | | |
|---|---|---|---|
| 3,411,947 | 11/1968 | Block et al. | 117/215 |
| 3,567,658 | 3/1971 | Webb et al. | 252/506 |
| 3,723,175 | 3/1973 | Masuyama et al. | 117/201 |
| 4,015,230 | 3/1977 | Nitta et al. | 338/35 |
| 4,065,743 | 12/1977 | Wahlers et al. | 338/308 |
| 4,094,061 | 6/1978 | Gupta et al. | 29/612 |
| 4,172,922 | 10/1979 | Merz et al. | 428/432 |
| 4,215,020 | 7/1980 | Wahlers et al. | 252/519 |
| 4,256,796 | 3/1981 | Hang et al. | 428/210 |
| 4,369,220 | 1/1983 | Prabhu | 428/209 |
| 4,376,725 | 3/1983 | Prabhu | 252/512 |
| 4,379,195 | 4/1983 | Prabhu | 428/209 |
| 4,401,709 | 8/1983 | Prabhu | 428/209 |
| 4,415,624 | 11/1983 | Prabhu | 428/209 |

*Primary Examiner*—Ellis P. Robinson
*Attorney, Agent, or Firm*—Birgit E. Morris; R. Hain Swope

[57] ABSTRACT

Low value resistor inks comprising a conductive component consisting of stannous oxide and molybdenum trioxide or a mixture of molybdenum trioxide and metallic molybdenum; a glass powder selected from the group consisting of a barium aluminum borate glass and a barium calcium borosilicate glass; and a suitable organic vehicle are improved by the addition of a TCR modifier. Cadmium oxide is added to raise the TCR value of the subject resistor inks, and ferric oxide, vanadium oxide or mixtures thereof is added to lower the TCR value thereof.

15 Claims, No Drawings

LOW VALUE RESISTOR INKS

This invention pertains to low value thick-film resistor inks having improved temperature coefficient of resistance.

BACKGROUND OF THE INVENTION

The use of specialized ink formulations to form thick films having various functions on suitable substrates in the construction of multilayer circuit structures is known. We have developed low value, thick-film resistor inks based on stannous oxide in combination with molybdenum trioxide and, optionally, metallic molybdenum. These inks and their preparation are disclosed in our copending U.S. Patent Application Ser. No. 280,937, filed July 6, 1981 now U.S. Pat. No. 4,379,195, the disclosure of which is incorporated herein by reference.

The subject inks are compatible with conventional substrates and are particularly suited for use with porcelain-coated metal substrates for circuit fabrication which are disclosed in Hang et al., U.S. Pat. No. 4,256,796, issued Mar. 17, 1981, the disclosure of which is incorporated herein by reference. The subject inks are also compatible with inks having various other functions which are formulated for use on the Hang et al. substrates.

The subject inks are low value resistor inks, i.e., they are formulated to have resistance values of from about 5 ohms per square to about 1000 ohms per square. The subject inks are characterized by a stable temperature coefficient of resistance (TCR) at both ends of this range.

SUMMARY OF THE INVENTION

The improved low value resistor inks provided in accordance with this invention comprise a barium aluminum borate glass or barium calcium borosilicate glass; a conductive component comprising stannous oxide and either molybdenum trioxide or a combination of molybdenum trioxide and metallic molybdenum; cadmium oxide as a modifier to raise the TCR, or ferric oxide, vanadium oxide or mixtures thereof to lower the TCR; and a suitable organic vehicle.

DETAILED DESCRIPTION OF THE INVENTION

In accordance with this invention, there are provided improved low value resistor inks of high reliability useful in the production of complex single-or multilayer thick-film circuits on porcelain-coated metal circuit boards. While the resistor inks of this invention are particularly useful in connection with circuits formed on the Hang et al. porcelain-coated metal boards, they can be effectively utilized with conventional boards presently available, e.g., alumina boards. While the range of resistance values which constitutes low value resistance is somewhat arbitrary, those skilled in the art generally consider it to be between about 5 and 1000 ohms/square. The range given for the subject inks in our copending U.S. Patent Application Ser. No. 280,937 is between about 10 and 500 ohms/square. It has been found in accordance with this invention that the TCR values for the subject inks at the upper and lower ends of the conventional range could be stabilized and brought well within acceptable levels by the addition thereto of certain TCR modifiers.

More particularly, it has been found that formulations of the subject inks having resistance values in the upper or high end of the low range, i.e. values of from about 500 to about 1000 ohms/square, had substantially negative TCR values, i.e. from $-300$ to $-600$ ppm/° C. Such negative values are unacceptable. Further, it has been found that formulations having very low resistance value, i.e. values of from about 5 to about 50 ohms/square, had high TCR values, i.e. 400 to 600 ppm/° C. Because the TCR value should be as close to zero as possible, these values are also unacceptable. In accordance with this invention, improved resistor inks are provided which have a TCR value approaching zero for the full range of low value resistance, i.e. from about 5 to 1000 ohms per square.

When the subject inks have a resistance value in the upper end of the low range, the TCR is brought into acceptable levels by the addition of from about 0.5 to about 10 percent by weight of cadmium oxide. When the subject inks have a resistance value in the lower end of the low range, the TCR is brought into acceptable levels by the addition of about 0.5 to about 10 percent by weight of ferric oxide, vanadium oxide or mixtures thereof. The term "vanadium oxide" as used herein includes both vanadium trioxide, $V_2O_3$, and vanadium pentoxide $V_2O_5$. Vanadium oxide and ferric oxide, when present together, may be combined in any proportion. The presence of these additives controls the TCR so that it is well within the acceptable level of plus or minus about 200 ppm/° C.

The glass frit component of the subject inks may be either a barium aluminum borate glass or a barium calcium borosilicate glass.

The barium aluminum borate glass comprises, on a weight basis, (a) from about 40 to 55 percent, preferably about 45 percent, of barium oxide;

(b) from about 16 to about 22 percent, preferably about 20 percent, of aluminum oxide; and (c) from about 14 to about 40 percent, preferably about 35 percent, of boron trioxide.

The barium calcium borosilicate glass comprises, on a weight basis:

(a) from about 40 to about 55 percent, preferably about 52 percent, of barium oxide;

(b) from about 10 to about 15 percent, preferably about 12 percent, of calcium oxide;

(c) from about 14 to about 25 percent, preferably about 16 percent of boron trioxide; and (d) from about 13 to about 23 percent, preferably about 20 percent, of silicon dioxide.

Both of these glass frits are compatible with the Hang et al. substrates. The glass frit comprises from about 10 to about 65 percent by weight, preferably from about 15 to about 30 percent by weight of the subject inks.

The organic vehicle of the subject inks comprises one or more conventional binders such as, for example, cellulose derivatives, particularly ethyl cellulose, synthetic resins such as polyacrylates or methacrylates, polyesters, polyolefins and the like. Preferred commercially available vehicles include, for example, pure liquid polybutenes available as Amoco H-25, Amoco H-50 and Amoco L-100 from Amoco Chemicals Corporation, poly(n-butylmethacrylate) available from E. I. duPont de Nemours and Co., and the like. If desired, the vehicle can contain suitable viscosity modifier solvents such as those conventionally used in similar ink compositions, e.g. pine oil, terpineol, butyl carbitol acetate, an ester alcohol available from Texas Eastman Company under the trademark Texanol and the like, or a solid material such as, for example, a castor oil derivative available from N. L. Industries under the trademark Thixatrol. The organic vehicle comprises from about 5 to about 40 percent by weight, preferably from about 20 to about 30 percent by weight, of the subject inks.

The conductive component of the subject resistor inks is a mixture of stannous oxide and molybdenum trioxide, a portion of which may be replaced with metallic molybdenum. Metallic molybdenum is present in inks in the lower end of the low range, i.e. those having resistance values under 100 ohms per square, particularly from about 5 to about 50 ohms per square.

The conductive component of the subject inks contains from about 40 to about 95 percent by weight, preferably from about 50 to 90 percent by weight, of molybdenum trioxide and from about 5 to about 60 percent by weight, preferably from about 10 to about 50 percent by weight, of stannous oxide. Molybdenum metal, when present, replaces from about 5 percent to about 70 percent by weight of the molybdenum trioxide. These percentages are based on the molybdenum trioxide content and not on the conductive component as a whole. The conductive component comprises from about 30 to about 85 percent by weight, preferably from about 45 to about 65 percent by weight, of the subject resistor inks.

The improved resistor inks of this invention are applied to the substrate board, e.g. conventional alumina boards or the improved porcelain-coated metal boards of Hang et al., by conventional means, i.e. screen printing, brushing, spraying and the like, with screen printing being preferred. The coating of ink is then dried in air at 100°-125° C. for about 15 minutes. The resulting film is then fired in nitrogen at peak temperatures of from 850° to 950° C. for from 4 to 10 minutes. As is conventional in the art, the subject resistor inks are generally applied and fired on the substrate board after all conductor inks have been applied and fired. The resistor values of the fired films can be adjusted by conventional means such as laser trimming or air abrasive trimming. In addition to acceptable TCR at both ends of the low value range, films formed from the subject resistor inks have demonstrated very good current noise, laser trimmability and stability to the effects of thermal shock, solder dipping, thermal storage, power loading and humidity.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Resistor inks having resistance values in the upper end of the low range were prepared from the following formulations:

| | Percent | | |
|---|---|---|---|
| | A | B | C |
| SnO | 19.0 | 8.6 | 18.18 |
| $MoO_3$ | 23.8 | 26.1 | 18.18 |
| Mo | 4.8 | 10.5 | — |
| CdO | — | 5.2 | — |
| Glass Frit | 28.6 | 23.5 | 36.36 |
| Vehicle | 23.8 | 26.1 | 27.28 |

In the above formulations, the glass frit was comprised of 45 percent of barium oxide, 20 percent of aluminum oxide and 35 percent of boron trioxide. The vehicle was a 6 percent by weight solution of ethyl cellulose in the ester alcohol Texanol.

The powder ingredients were combined with the organic vehicle, initially mixed by hand and then on a 3 roll mill with shearing to obtain a smooth paste suitable for screen printing. Additional vehicle was added to replace loss during mixing and to assure proper rheology.

Copper conductor inks were applied and fired onto a porcelain-coated steel substrate of the type disclosed by Hang et al. The above inks were then printed onto the substrates, air dried at 125° for 10 minutes and fired in nitrogen in a belt furnace at a peak temperature of 900° for 4 to 6 minutes. In all instances, the width of the resistor film was 100 mils. The sheet resistivity and hot TCR of the resistors were determined. The results are reported in Table I.

TABLE I

| Formulation | Sheet Resistivity (Ω/□) | Hot TCR (+25° to +125°, ppm/°C.) |
|---|---|---|
| A | 628 | −402 |
| B | 591 | +236 |
| C | 660 | −299 |

The results in Table I demonstrate the effectiveness of cadmium oxide in raising the TCR values of the subject resistor inks.

EXAMPLE 2

Resistor inks having resistance values in the lower end of the low value range were prepared from the following formulations according to the procedure of Example 1.

| | Percent | | | | |
|---|---|---|---|---|---|
| Ingredient | A | B | C | D | E |
| SnO | 10.0 | 5.3 | 5.3 | 5.3 | 5.3 |
| $MoO_3$ | 25.0 | 32.0 | 31.6 | 31.6 | 31.6 |
| Mo | 25.0 | 24.0 | 23.7 | 23.7 | 23.7 |
| $Fe_2O_3$ | — | 1.3 | 2.6 | — | 1.3 |
| $V_2O_5$ | — | — | — | 2.6 | 1.3 |
| Glass Frit | 15.0 | 13.4 | 13.1 | 13.1 | 13.1 |
| Vehicle | 25.0 | 24.0 | 23.7 | 23.7 | 23.7 |

The glass frit and vehicle were as in Example 1. The inks were screened and fired as in Example 1 and the sheet resistivities and TCR values determined. The results are given in Table II.

TABLE II

| Formulation | Sheet Resistivity (Ω/□) | Hot TCR (+25° to +125°, ppm/°C.) |
|---|---|---|
| A | 6 | +500 |
| B | 13.9 | +241 |
| C | 12.1 | +53 |
| D | 14.9 | +270 |

TABLE II-continued

| Formulation | Sheet Resistivity (Ω/□) | Hot TCR (+25° to +125°, ppm/°C.) |
|---|---|---|
| E | 13.1 | +124 |

The results in Table II demonstrate the effectiveness of ferric oxide, vanadium oxide and mixtures thereof in lowering the TCR values of the subject resistor inks. These results demonstrate the excellent TCR control provided by the subject modifiers throughout the low value range. All films demonstrated good thermal stability.

We claim:

1. In a resistor ink suitable for forming a resistor film on a circuit board comprising:
   (a) from about 30 to about 85 percent by weight of a conductive component comprising stannous oxide and molybdenum trioxide or a mixture of molybdenum trioxide and metallic molybdenum;
   (b) from about 10 to about 65 percent by weight of a glass selected from the group consisting of barium aluminum borate glass and barium calcium borosilicate glass; and
   (c) from about 5 to about 40 percent by weight of a suitable organic vehicle;
   the improvement comprising adding to said ink from about 0.5 to about 10 percent by weight of a temperature coefficient of resistance modifier comprising:
   (i) cadmium oxide; or
   (ii) ferric oxide, vanadium oxide or mixtures thereof.

2. An improved resistor ink in accordance with claim 1, wherein said ink comprises from about 45 to about 65 percent by weight of said conductive ingredient, from about 15 to about 30 percent by weight of said glass and from about 20 to about 30 percent by weight of said vehicle.

3. An improved resistor ink in accordance with claim 1, wherein said modifier is added to lower the temperature coefficient of resistance and said modifier is ferric oxide, vanadium oxide or mixtures thereof.

4. An improved resistor ink in accordance with claim 3 wherein the resistance value of a film formed therefrom is between about 5 and 50 ohms per square.

5. An improved resistor ink in accordance with claim 1, wherein said modifier is added to raise the temperature coefficient of resistance, and said modifier is cadmium oxide.

6. An improved resistor ink in accordance with claim 5, wherein the resistance value of a film formed therefrom is between about 500 and 1000 ohms per square.

7. A circuit board having on a portion of the surface thereof a coating of an improved resistor ink comprising:
   (a) from about 30 to about 85 percent by weight of a conductive component comprising stannous oxide and molybdenum trioxide or a mixture of molybdenum trioxide and metallic molybdenum;
   (b) from about 10 to about 65 percent by weight of a glass selected from the group consisting of barium aluminum borate glass and barium calcium borosilicate glass;
   (c) from about 5 to about 40 percent by weight of a suitable organic vehicle; and
   (d) from about 0.5 to about 10 percent by weight of a temperature coefficient of resistance modifier comprising:
   (i) cadmium oxide; or
   (ii) ferric oxide, vanadium oxide or mixtures thereof.

8. A circuit board in accordance with claim 7, wherein said board is porcelain-coated metal.

9. A circuit board in accordance with claim 8, wherein said metal is steel.

10. An electronic assembly comprising a circuit board having a circuit thereon, said circuit containing a resistor film formed by applying and firing a resistor ink comprising:
   (a) from about 30 to about 85 percent by weight of a conductive component comprising stannous oxide and molybdenum trioxide or a mixture of molybdenum trioxide and metallic molybdenum;
   (b) from about 10 to about 65 percent by weight of glass selected from the group consisting of barium aluminum borate glass and barium calcium borosilicate glass;
   (c) from about 5 to about 40 percent by weight of a suitable organic vehicle; and
   (d) from about 0.5 to about 10 percent by weight of a temperature coefficient of resistance modifier comprising:
   (i) cadmium oxide; or
   (ii) ferric oxide, vanadium oxide or mixtures thereof.

11. An electronic assembly in accordance with claim 10, wherein said modifier is present in said ink in about 5 percent by weight.

12. An electronic assembly in accordance with claim 10, wherein said resistor film has a resistance value between about 5 and 50 ohms per square and said modifier is ferric oxide, vanadium oxide or mixtures thereof.

13. An electronic assembly in accordance with claim 10, wherein said resistor film has a resistance value between about 500 and 1000 ohms per square and said modifier is cadmium oxide.

14. An electronic assembly in accordance with claim 10 wherein said circuit board is porcelain-coated metal.

15. An electronic assembly in accordance with claim 14, wherein said metal is steel.

* * * * *